US009513319B1

(12) United States Patent
Fosler et al.

(10) Patent No.: US 9,513,319 B1
(45) Date of Patent: Dec. 6, 2016

(54) SYSTEMS, METHODS, AND DEVICES FOR ENERGY AND POWER METERING

(71) Applicant: Cypress Semiconductor Corporation, San Jose, CA (US)

(72) Inventors: Ross Martin Fosler, Snohomish, WA (US); Christopher Corson Keeser, Everett, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/866,225

(22) Filed: Sep. 25, 2015

Related U.S. Application Data

(60) Provisional application No. 62/084,011, filed on Nov. 25, 2014.

(51) Int. Cl.
*G01R 31/26* (2014.01)
*G01R 21/133* (2006.01)
(Continued)

(52) U.S. Cl.
CPC ............ *G01R 21/133* (2013.01); *G01R 15/20* (2013.01); *G05B 19/056* (2013.01); *G05F 1/66* (2013.01); *G05B 2219/15097* (2013.01)

(58) Field of Classification Search
CPC  G01R 21/133; G01R 21/08; G01R 19/2513; G01R 22/06; G01R 22/10; G01R 15/20; H03K 19/20; G05B 19/05; G05B 19/056; G05B 2219/15097; G05F 1/66
USPC ....... 324/761.01, 764.01, 771; 361/157, 659, 361/661; 455/115.4, 226.4
See application file for complete search history.

(56) References Cited

U.S. PATENT DOCUMENTS 4,884,021 A * 11/1989 Hammond ........... G01R 21/133
324/116
5,545,981 A * 8/1996 Dubin ................ G01R 21/1331
324/142

(Continued)

FOREIGN PATENT DOCUMENTS

CN        102035554 B     4/2014
DE   102007051794 A1 *  5/2009 ............. G01R 22/10

OTHER PUBLICATIONS

Ludek Slosarcik, "Using the FFT on SIGMA-Delta ADC's", Freescale Semiconductor, Inc., Rev. 2, Jul. 2015, pp. 1-16.

(Continued)

Primary Examiner — Patrick Assouad
Assistant Examiner — Sean Curtis

(57) ABSTRACT

Disclosed herein are systems, methods, and devices for power and energy metering. Devices may include first processing logic coupled to an isolator and configured to receive a first bit stream from a first modulator via the isolator. The first bit stream may be generated by the first modulator based on a first analog signal. The first processing logic may be further configured to receive a second bit stream from a second modulator via the isolator. The second bit stream may be generated by the second modulator based on a second analog signal. The processing logic may be further configured to generate a third bit stream based on a combination of the first bit stream with the second bit stream. The devices may also include second processing logic configured to generate an output signal based on one or more values of the third bit stream. The output signal may characterize a measurement of electrical power associated with an electrical circuit.

18 Claims, 8 Drawing Sheets

(51) Int. Cl.
*G01R 15/20* (2006.01)
*G05B 19/05* (2006.01)
*G05F 1/66* (2006.01)

(56) References Cited

U.S. PATENT DOCUMENTS

| | | | | |
|---|---|---|---|---|
| 5,657,237 | A * | 8/1997 | Mazzoni | G01R 21/1331 324/140 R |
| 5,701,253 | A * | 12/1997 | Mayell | G01R 21/133 324/142 |
| 6,064,326 | A * | 5/2000 | Krone | H03M 3/362 341/118 |
| 6,377,037 | B1 * | 4/2002 | Burns | G01R 21/133 324/107 |
| 6,417,792 | B1 | 7/2002 | King et al. | |
| 6,555,997 | B1 * | 4/2003 | De Vries | G01R 21/133 324/142 |
| 7,091,774 | B1 * | 8/2006 | Smiley | H03F 1/0205 330/124 R |
| 7,288,940 | B2 * | 10/2007 | Wynne | G01D 5/24 324/415 |
| 7,474,087 | B2 * | 1/2009 | Fritz | G01R 21/06 324/107 |
| 7,609,051 | B2 * | 10/2009 | Fritz | G01R 21/133 324/103 R |
| 7,689,374 | B2 * | 3/2010 | Rzehak | G01R 21/133 702/60 |
| 7,737,679 | B2 * | 6/2010 | Rzehak | G01R 22/10 324/126 |
| 8,536,998 | B1 | 9/2013 | Siu et al. | |
| 8,674,544 | B2 * | 3/2014 | Rada | G05F 1/70 307/38 |
| 8,693,217 | B2 * | 4/2014 | Mao | H02M 3/33523 323/283 |
| 8,742,968 | B2 | 6/2014 | Quiquempoix | |
| 8,873,211 | B1 * | 10/2014 | Butler | H02H 9/04 361/86 |
| 8,896,182 | B2 * | 11/2014 | Glaser | H01L 41/042 310/317 |
| 8,958,217 | B2 * | 2/2015 | Ramabhadran | H02M 7/53803 363/21.12 |
| 9,000,675 | B2 * | 4/2015 | Chang | H04L 27/10 315/201 |
| 9,201,104 | B2 * | 12/2015 | Jackson | G01R 21/133 |
| 2003/0042886 | A1 * | 3/2003 | Gandhi | G01R 35/005 324/142 |
| 2003/0135338 | A1 | 7/2003 | Knaus et al. | |
| 2005/0212505 | A1 * | 9/2005 | Murray | G01R 15/146 324/126 |
| 2006/0153495 | A1 * | 7/2006 | Wynne | G01D 5/24 385/22 |
| 2007/0200552 | A1 * | 8/2007 | Fritz | G01R 21/06 324/142 |
| 2007/0279041 | A1 * | 12/2007 | Fritz | G01R 21/133 324/142 |
| 2008/0077336 | A1 * | 3/2008 | Fernandes | G01R 15/142 702/57 |
| 2008/0158914 | A1 * | 7/2008 | Bakker | H02M 3/33569 363/17 |
| 2008/0204289 | A1 * | 8/2008 | Miettinen | H03M 3/474 341/141 |
| 2009/0121705 | A1 * | 5/2009 | Rzehak | G01R 22/10 324/142 |
| 2011/0148202 | A1 * | 6/2011 | Rada | G05F 1/70 307/52 |
| 2013/0163688 | A1 * | 6/2013 | Calvin | G01D 21/00 375/272 |
| 2013/0278077 | A1 * | 10/2013 | Mueck | H02J 1/02 307/105 |
| 2013/0278438 | A1 * | 10/2013 | Mueck | G08C 15/00 340/870.16 |
| 2014/0084687 | A1 * | 3/2014 | Dent | H02M 1/32 307/26 |
| 2014/0097691 | A1 * | 4/2014 | Jackson | G01R 21/133 307/66 |
| 2014/0266269 | A1 * | 9/2014 | Ausserlechner | G01R 1/203 324/713 |
| 2015/0244172 | A1 * | 8/2015 | Trudel | H02J 3/12 307/129 |
| 2015/0369846 | A1 * | 12/2015 | Rayon | G01R 15/181 324/127 |
| 2016/0065701 | A1 * | 3/2016 | Shepard | H04L 69/26 713/323 |

OTHER PUBLICATIONS

ST, "Programmable Single phase energy metering IC with tamper detection", www.st.com, Jun. 2011, pp. 1-60.
Texas Instruments, "MSP430AFE2x3 single-phase energy meter IC", 2011, www.ti.com, pp. 1-3.

* cited by examiner

SYSTEMS, METHODS, AND DEVICES FOR ENERGY AND POWER METERING

CROSS-REFERENCE TO RELATED APPLICATIONS

This application claims the benefit under 35 U.S.C. §119 (e) of US Provisional Patent Application No. 62/084,011, filed on 2014 Nov. 25, which is incorporated by reference herein in its entirety for all purposes.

TECHNICAL FIELD

This disclosure generally relates to power supplies as well as inverters and, more specifically, to energy and power metering associated with power supplies and inverters.

BACKGROUND

Components of electrical circuits may be monitored and measured to ensure that various operational parameters associated with those components are maintained. For example, components such as power supplies and power inverters may be monitored to ensure that their respective outputs remain within tolerances of components and circuits that depend upon those power supplies and power inverters. In one example, a power signal generated by a power supply may be monitored to ensure that the power signal provides sufficient power to other components of the electrical circuit. Techniques for measuring and monitoring such power supplies and power inverters remain limited because they are computationally complex and are often difficult, costly, and impractical to implement.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific examples, it will be understood that these examples are not intended to be limiting.

Some techniques for measuring and monitoring such power supplies and power inverters may be computationally complex, and are often difficult, costly, and impractical to implement. For example, such techniques may utilize a component, such as an analog-to-digital-converter (ADC), to directly sample analog signals within the power supply, digitize those signals, and then perform computationally complex operations, such as squaring the signal and obtaining the square root to determine a root mean square (RMS) value. Such an approach may be computationally and hardware intensive as additional hardware and computational resources may be utilized, such as a multi-channel ADC and logic for the RMS calculation.

Various embodiments disclosed herein may utilize a combination of modulators, as well as other processing logic, to generate a representation of a measured power and energy of a circuit and/or a power supply or inverter associated with the circuit. Accordingly, modulators, which may be sigma delta modulators, may convert sensed analog signals, which may be sensed voltages and currents, into bit streams that may be a single bit wide. Such bit streams may be passed through an isolation circuit or isolator and provided to processing logic which may be configured to combine the bit streams and generate a representation of a measured energy and/or power based on the combination. Accordingly, embodiments as disclosed herein measure and meter power and energy of components, such as power supplies and inverters, without the use of hardware intensive ADCs and without the implementation of intensive computations, such as RMS calculations.

As will be discussed in greater detail below, embodiments as disclosed herein may be included in various power components, such as alternating current (AC)/direct current (DC) power supplies. Such AC/DC power supplies may be included in servers that may be used in telecommunications applications. Moreover, such AC/DC power supplies may also be implemented in solar inverters, such as microinverters included in solar panels. Accordingly, embodiments as disclosed herein may be implemented in power components such as power inverters included in solar panels. Moreover, other applications may include metering integrated chips (ICs) and various other energy measurement equipment.

Figure 1:
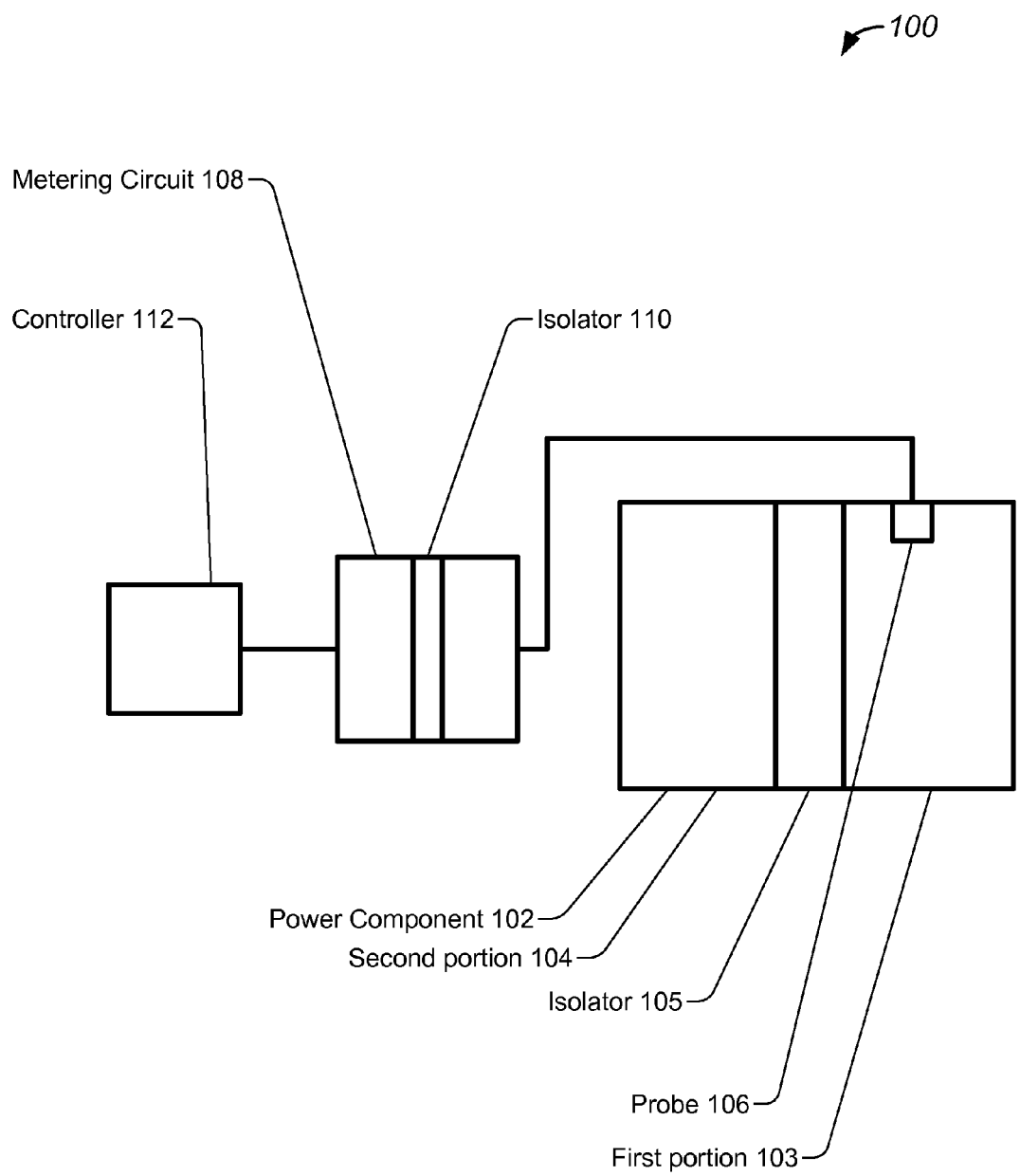
FIG. 1 illustrates an example of a system for metering energy and power, configured in accordance with some embodiments.

FIG. 1 illustrates an example of a system for metering energy and power, configured in accordance with some embodiments. As discussed above, metering circuits and systems as disclosed herein may be configured to measure, meter, and compute energy and power levels associated with various power components, which may be power supplies and power inverters. As will be discussed in greater detail below, metering circuits and systems, such as system 100, may include several power components, at least one metering circuit which may be coupled to one or more power components, and at least one controller that may be configured to implement one or more operations based on an output generated by the metering circuit.

Accordingly, in various embodiments, system 100 includes power component 102 which may be a power supply or power inverter. For example, power component 102 may be an AC/DC power supply that may be configured to generate a DC power signal based on a received AC power signal. In another example, power component 102 may be a power inverter included in a solar panel. In various embodiments, different components of power component 102 may be separated from each other as well as other components of system 100 by galvanic isolation. Such isolation may be provided by isolators such as isolator 105 and isolator 110, and may provide such isolation for the protection of components within system 100. For example, power component 102 may include components in first portion 103 which may be on a first side of galvanic isolation provided by isolator 105. Power component 102 may also include second portion 104 which may include components implemented on a second side of galvanic isolation provided by isolator 105. In various embodiments, signals to be measured by metering circuit 108 may originate from components implemented in first portion 103. Accordingly, sensors or probes, such as probe 106, may be implemented to obtain such measurements. As will be discussed in greater detail below, such measurements may be analog signals that include voltage signals and/or current signals associated with power component 102.

System 100 may also include metering circuit 108. As will be discussed in greater detail below, metering circuit 108 may be configured to determine an energy and/or power associated with power component 102. Accordingly, metering circuit 108 may be configured to generate an output signal that may be configured to determine or identify a measured power and/or energy of power component 102. As will be discussed in greater detail below, metering circuit 108 may be configured such that the use of hardware intensive ADCs and computationally intensive operations is reduced. As shown in FIG. 1, metering circuit 108 may receive signals from probes, such as probe 106, which may be provided to a first side of isolator 110, and an output signal may be generated, at least in part, by components implemented on a second side of isolator 110.

In various embodiments, metering circuit 108 may be implemented on a common carrier substrate such as, for example, an integrated circuit ("IC") die substrate, a multi-chip module substrate, or the like. Alternatively, the components of metering circuit 108 may be one or more separate integrated circuits and/or discrete components. In some embodiments, metering circuit 108 may be implemented using the Programmable System on a Chip ("PSoC®") processing device, developed by Cypress Semiconductor Corporation, San Jose, Calif. Alternatively, metering circuit 108 may be implemented using one or more other processing devices, such as a microprocessor or central processing unit, special-purpose processor, digital signal processor ("DSP"), an application specific integrated circuit ("ASIC"), a field programmable gate array ("FPGA"), or the like.

In some embodiments, metering circuit 108 and controller 112 may be implemented within power component 102. Accordingly, isolator 110 and isolator 105 may be part of the same isolator, and various components of metering circuit 108, such as processing logic that may be implemented using the PSoC, may be implemented on one side of galvanic isolation, such as within second portion 104, while other components, such as a modulator block, may be implemented on another side of galvanic isolation, such as first portion 103.

System 100 may further include controller 112. In various embodiments, controller 112 may be configured to perform one or more operations in response to receiving the output signal from metering circuit 108, and may be further configured to generate a control signal based on the received output signal. For example, controller 112 may be configured generate a select signal or a control signal that may be provided to power component 102 and may be configured control or modify an operation of power component 102. In some embodiments, controller 112 may be configured to generate a status signal which may be provided to various other system components for diagnostic and maintenance purposes.

Figure 2:
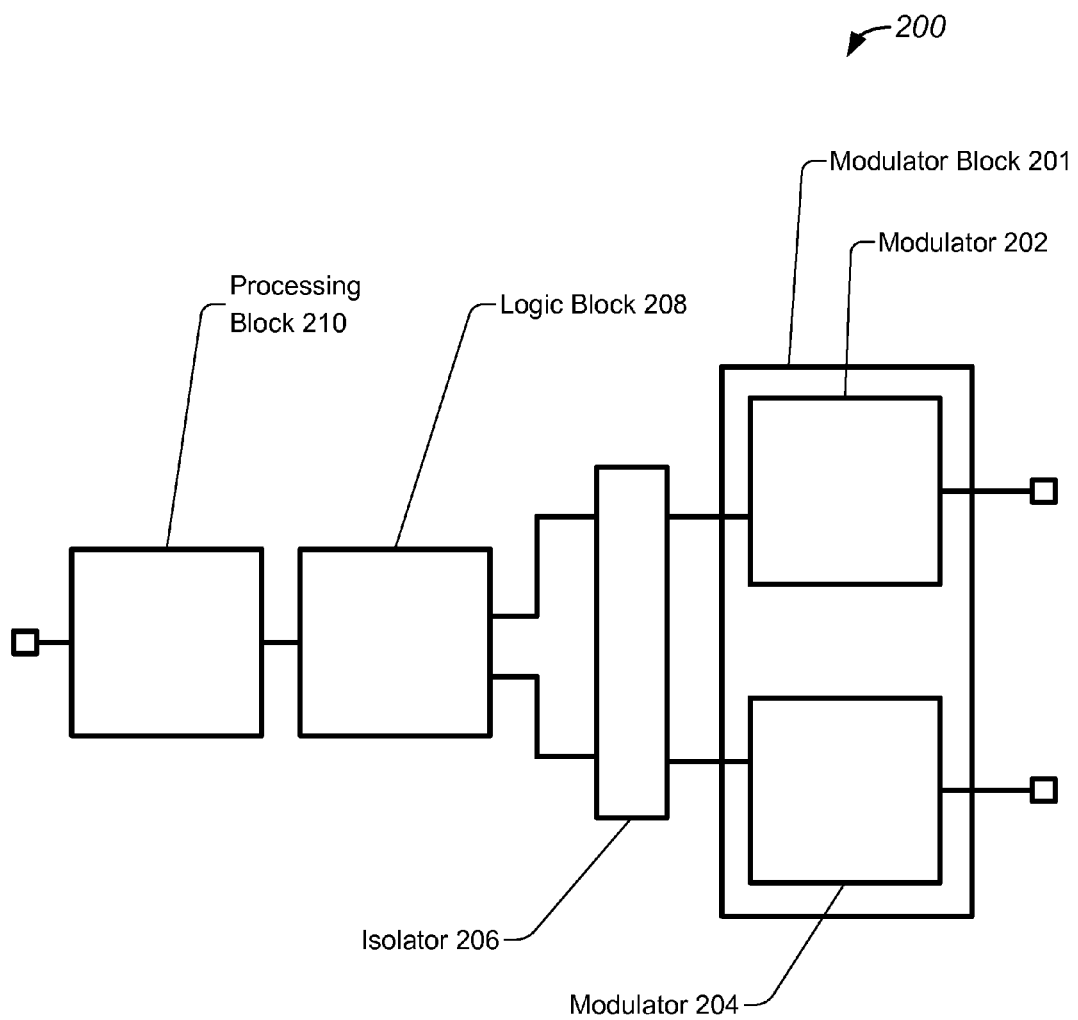
FIG. 2 illustrates an example of a circuit for metering energy and power, configured in accordance with various embodiments.

FIG. 2 illustrates an example of a circuit 200 for metering energy and power, configured in accordance with various embodiments. As discussed above, metering circuits and systems as disclosed herein may be configured to measure, meter, and compute energy and power levels associated with various power components, which may be power supplies and power inverters. As will be discussed in greater detail below, components of the metering circuits may be galvanically isolated from one another. Thus, some processing may be performed on a first side of galvanic isolation and before the signal has passed through an isolator. Implementing the processing of the sensed signals and the determination of the measured energy and/or power in this way reduces the overall utilization of hardware intensive ADCs, computationally intensive calculations, as well as complicated isolation channels that may otherwise be utilized.

Circuit 200 includes a modulator block 201. In various embodiments, modulator block 201 may be configured to include one or more modulators which may be implemented in one or more components of system 100 discussed above. For example, modulator block 201 may include modulator 202 and modulator 204 which may each be implemented in switched capacitor blocks of metering circuit 108 which may be a PSoC. In various embodiments, at least one of the modulators may be a sigma delta modulator. Accordingly, each of modulator 202 and modulator 204 may be a sigma delta modulator. As disclosed herein, a sigma delta modulator may be configured to encode analog signals into digital signals. Accordingly, each sigma delta modulator may include an input terminal configured to receive an analog signal, and may also include an output terminal configured to output a digital signal that is generated based on the received analog signal. As will be discussed in greater detail below with reference to FIG. 3, each sigma delta modulator may be configured to generate a bit stream based on a received analog signal. Accordingly, the bit stream generated by the sigma delta modulator may be a digital signal that has a density that is proportional to an amplitude and/or frequency of the analog signal. In this way, the digital bit stream that is generated characterizes or represents the analog signal that was initially received.

In various embodiments, modulator 202 may be configured to receive a first analog signal that characterizes a voltage of one or more other components of a system or component in which circuit 200 is implemented. For example, the first analog signal may be received from a sensor or probe that may be coupled to a power supply that is used to provide power to various electrical components as well as circuit 200. In another example, the first analog signal may be received from a sensor or probe that may be coupled to an inverter. In this way, modulator 202 may be configured to receive analog signals characterizing voltages from one or more other components that may be implemented in circuit 200 or external to circuit 200 and in another system, such as system 100. Moreover, modulator 202 may be configured to generate a first bit stream based on the first analog signal. In various embodiments, the first bit stream may have a density that is proportional to one or more characteristics of the first analog signal, and the first bit stream may be configured to include an encoded representation of the first analog signal.

According to some embodiments, modulator 204 may be configured to receive a second analog signal that characterizes a current from one or more other electrical components. Accordingly, as similarly discussed above with reference to modulator 202, modulator 204 may be configured to receive the second analog signal from a power supply or an inverter, and the second analog signal may characterize current levels associated with the power supply or inverter. Moreover, modulator 204 may be configured to generate a second bit stream based on the received second analog signal. In various embodiments, the second bit stream may have a density that is proportional to one or more characteristics of the second analog signal, and the second bit stream may be configured to include an encoded representation of the second analog signal. Additional details of modulators such as modulator 202 and modulator 204 are discussed in greater detail below with reference to FIG. 3.

Circuit 200 may also include logic block 208 which may include logic configured to implement one or more logical operations. Accordingly, logic block 208 may be configured to receive inputs, perform logical operations on the received inputs, and generate an output that characterizes the result of such logical operations. In some embodiments, logic block 208 may be implemented in programmable logic and may be configured to implement a logical AND operation on inputs received at logic block 208. In some embodiments, such inputs may include the first bit stream and the second bit stream. Accordingly, logic block 208 may be communicatively coupled to modulator block 201, as well as modulator 202 and modulator 204 included in modulator block 201. In this way, logic block 208 may be configured to receive the first bit stream and the second bit stream from modulator 202 and modulator 204 respectively. Logic block 208 may be further configured to implement one or more logical operations, such as a logical AND operation, on the first bit stream and the second bit stream to generate an output that includes a third bit stream. In this way, the result of such a logical operation may be provided as an output of logic block 208.

In some embodiments, the result of implementing a logical AND operation on the first bit stream and second bit stream is equivalent to calculating the product of the two bit streams. As previously discussed, the first bit stream may represent or characterize a sensed voltage. For example, the first bit stream may represent a voltage generated by a power supply. Moreover, the second bit stream may represent or characterize a current generated by the power supply. Accordingly, the third bit stream may characterize or represent the result of multiplying the sensed voltage and the sensed current.

In some embodiments, circuit 200 may also include isolator 206 which may be implemented between logic block 208 and modulator block 201, and may couple outputs of modulator 202 and modulator 204 within inputs of logic block 208. In various embodiments, isolator 206 may be implemented to provide electrical protection for various components of circuit 200. Moreover, isolator 206 may include single bit isolators which may be relatively easy to implement at relatively low cost.

Circuit 200 may further include processing block 210 which may be communicatively coupled to an output of logic block 208. In various embodiments, processing block 210 may be configured to implement one or more operations on the third bit stream to generate a fourth bit stream which may be an output signal of circuit 200. In various embodiments, the output generated by processing block 210 may characterize or represent a measured energy or power of the voltage supply or inverter from which the first analog signal and the second analog signal were received. Accordingly, processing block 210 may be configured to receive the third bit stream, and may be further configured to calculate a real energy and/or real power measured by circuit 200. In this way, an output generated by processing block 210 may provide metering of energy and power generated by system components such as power supplies and inverters without utilizing or occupying other components of the system, such as analog to digital converters and associated additional computational resources. Additional details of processing block 210 are discussed in greater detail below with reference to FIG. 4, FIG. 5, and FIG. 6.

Figure 3:
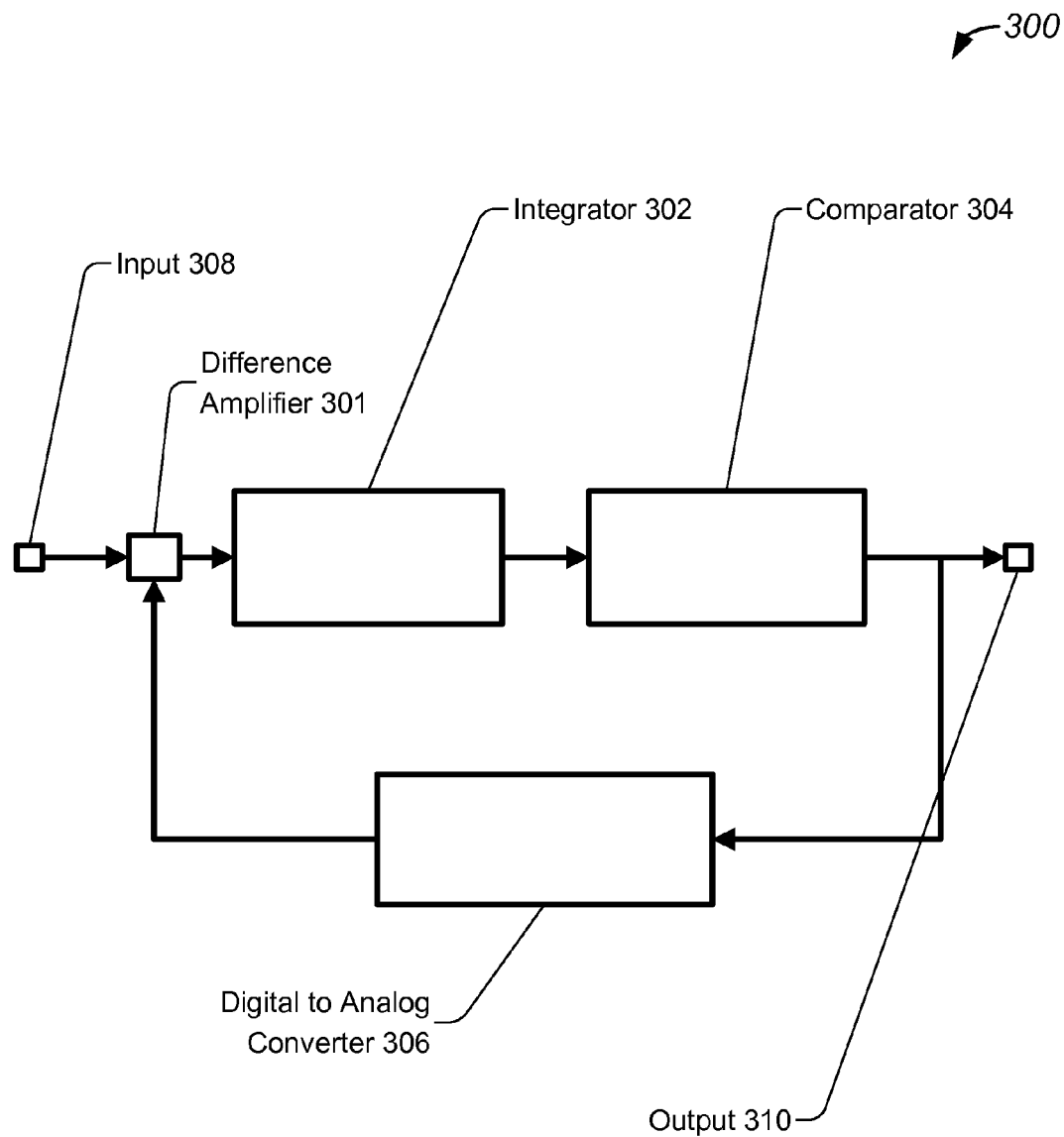
FIG. 3 illustrates an example of a modulator, configured in accordance with some embodiments.

FIG. 3 illustrates an example of a modulator 300, configured in accordance with some embodiments. As discussed above, a modulator may be configured to receive an analog signal at an analog input, such as input 308, and further configured to generate a high-speed, single-bit, modulated pulse wave that may be provided at a digital output, such as output 310. As will be discussed in greater detail below, a modulator, such as modulator 300, may include various components which may be configured to generate such a digital output. For example, modulator 300 may include difference amplifier 301 which may be coupled to input 308 and may receive the analog input signal via input 308. Difference amplifier 301 may also be coupled to an output of digital to analog converter 306. Accordingly, difference amplifier 301 may generate an analog voltage based on a difference between the input received at input 308 and the output generated by digital to analog converter 306. This analog voltage may be provided to integrator 302.

In various embodiments, integrator 302 may be configured to generate an output that may progress in a positive or negative direction based on the output of difference amplifier 301. The output of integrator 302 may be provided to comparator 304 which may be configured to sample the output at a frequency of $f_s$, and may be further configured to compare the output of integrator 302 against a reference voltage. Comparator 304 may also be configured to generate a positive or negative output voltage based on the result of the comparison. Accordingly, the output of comparator 304 maybe a pulse wave. This output may be provided to output 310 as well as digital to analog converter 306. In various embodiments, when comparator 304 switches from high to low or visa versa, digital to analog converter 306 may change the output voltage of difference amplifier 301 and cause integrator to progress in the opposite direction. The result is a time-domain output signal that is a pulse-wave representation of the input signal sampled at a sampling rate of $f_s$.

Figure 4:
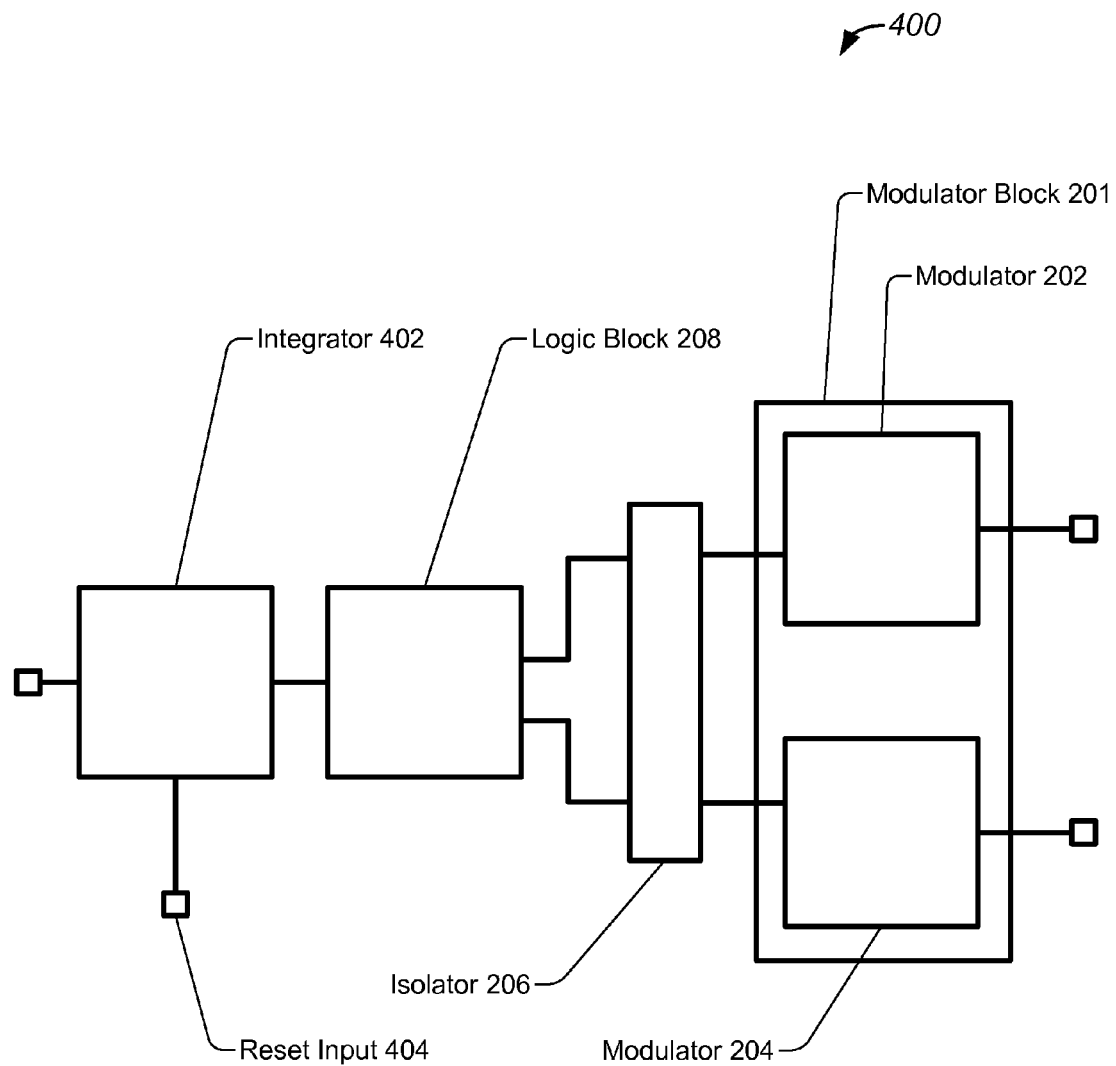
FIG. 4 illustrates another example of a circuit for metering energy and power, configured in accordance with various embodiments.

FIG. 4 illustrates another example of a circuit for metering energy and power, configured in accordance with various embodiments. As similarly discussed above, embodiments disclosed herein may be configured to implement a real energy computation that determines a measured or metered energy of another system component, such as a power supply or an inverter. In various embodiments, circuit 400 may include various components configured to receive analog signals as well as components configured to compute a real energy based on the received analog signals. Thus, circuit 400 may include modulator block 201 which may further include modulator 202 and modulator 204 implemented within modulator block 201. Furthermore, circuit 400 may also include isolator 206 and logic block 208.

In various embodiments, circuit 400 may include a processing block that is configured as integrator 402. As shown in FIG. 4, integrator 402 may be configured to receive an output of logic block 208 which may be a third bit stream, and may be further configured to generate an output signal based on the third bit stream. Accordingly, integrator 402 may be configured to integrate or aggregate data values represented in the third bit stream which, as previously discussed, may represent a product of a sensed voltage and a sensed current. Thus, integrator 402 may be configured to store data values characterizing an aggregation or integration of the third bit stream, and may be further configured to provide the stored data values as an output signal. In this way, the integration of the product of the voltage and current, which may be associated with a power supply, may yield a representation of a real energy of that power supply during a particular period of time.

In various embodiments, integrator 402 may be configured to receive a reset signal via reset input 404. The reset signal may be configured to periodically reset data values stored by integrator 402. Accordingly, integrator 402 may be configured to be reset periodically or dynamically. In various embodiments, the reset signal may be generated by a component, such as controller 112 discussed above. The resent signal may be generated based on a clock signal. For example, a clock signal may be provided to a frequency divider, and the output of the frequency divider may be utilized as the reset signal. In this way, the reset signal may be generated periodically and in response to a designated number of clock cycles elapsing.

In some embodiments, integrator 402 may be configured to output the stored data value prior to resetting the data value itself. For example, integrator 402 may store and update a data value that represents the integration or sum of data values received from logic block 208 via a third bit stream. Integrator 402 may then receive a reset signal. In response to receiving the reset signal, integrator 402 may output the current stored data value, and may subsequently reset the storage device used to store the data value. Accordingly, the data value that is output may represent a real energy that has been measured over the period of time between reset signals, and integrator 402 may being a new cycle of energy computation and measurement.

Figure 5:
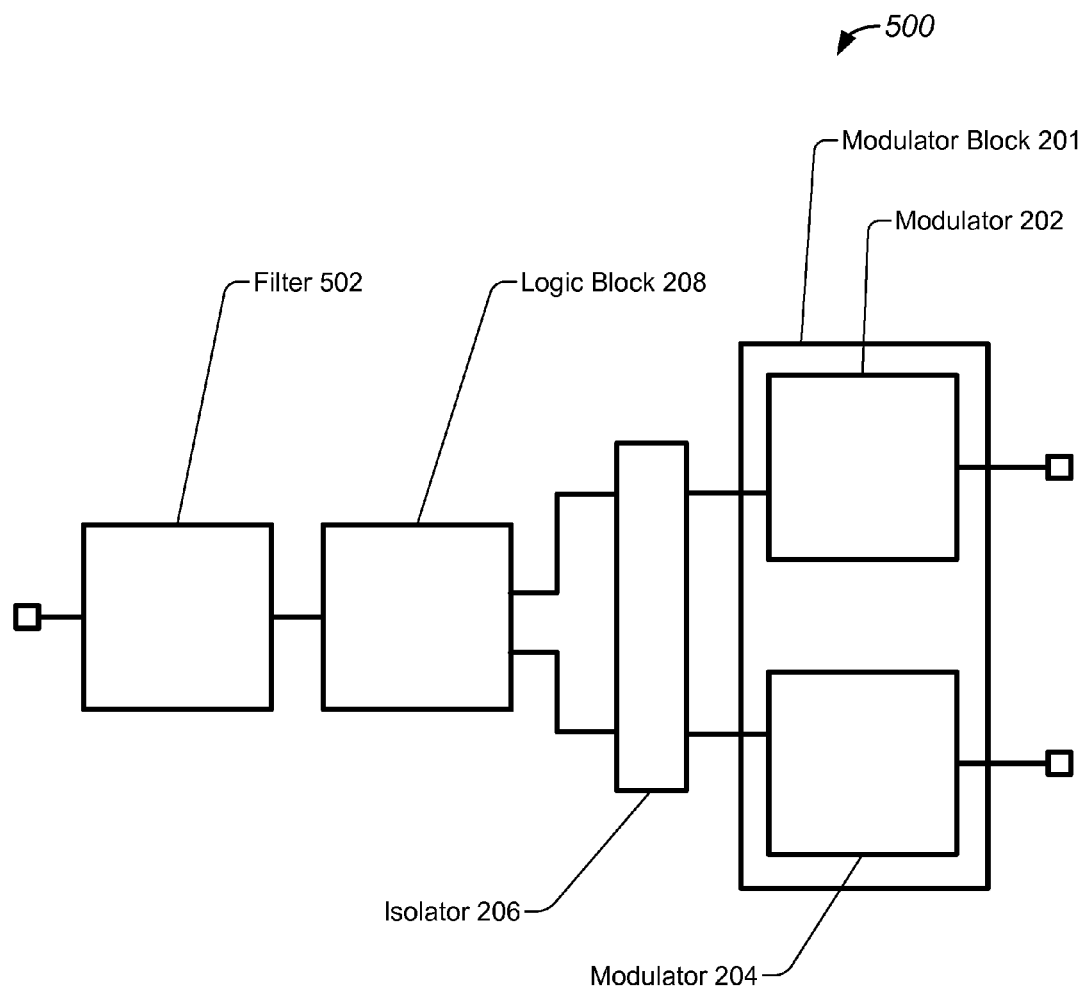
FIG. 5 illustrates yet another example of a circuit for metering energy and power, configured in accordance with various embodiments.

FIG. 5 illustrates yet another example of a circuit for metering energy and power, configured in accordance with various embodiments. As similarly discussed above, embodiments disclosed herein may be configured to implement a real power computation that determines a measured or metered power of another system component, such as a power supply or an inverter. In various embodiments, circuit 500 may include various components configured to receive analog signals as well as components configured to compute a real power based on the received analog signals. Thus, circuit 500 may include modulator block 201 which may further include modulator 202 and modulator 204 implemented within modulator block 201. Furthermore, circuit 500 may also include isolator 206 and logic block 208.

In various embodiments, circuit 500 may include a processing block that is configured as filter 502. As shown in FIG. 5, filter 502 may be configured as a digital filter, such as an infinite impulse response (IIR) filter that filters an output generated by logic block 208 which, as previously discussed, may be a third bit stream that characterizes a product of a sensed voltage and sensed current. In some embodiments, filter 502 may be configured to filter the third bit stream based on one or more designated frequencies. For example, filter 502 may be configured based on an operational frequency of a power supply. In such an example, the power supply may generate a power signal that has a frequency of about 60 Hz or 120 Hz. Accordingly, filter 502 may be configured to filter out frequencies that may be above and/or below 60 Hz or 120 Hz, depending on the power signal. When configured in this way, the output of filter 502 may characterize a product of the sensed voltage and sensed current, and thus characterize a measured power of the power supply. Furthermore, the output signal may be filtered such that only frequencies relevant to the power supply signal are included in the output signal, and other frequencies that may result from noise may be filtered out. When filtered in this way, processing of the sensed voltages and currents may be faster, and subsequent processing of the output signal may also be faster due to the fewer number of frequencies being analyzed.

In some embodiments, a representation of a digital filter, such as filter 502, may be modeled utilizing a series of shift operations and a particular placement of a specific pole. For example, a digital filter may be determined by the following equations derived from an analysis of an RC filter:

$$y[n] = \frac{\alpha y[n-1] + x[n]}{1 + \alpha} \quad (1)$$

To facilitate implementation in code that may be instantiated in reprogrammable logic without the use of costly and computationally operations such as division and fractional multiplication, it may be assumed that $\beta=1+\alpha$. Accordingly, equation 1 may be modified as shown below:

$$y[n] = \frac{\beta y[n-1] - y[n-1] + x[n]}{\beta} \quad (2)$$

Which may be simplified to:

$$\beta y[n] = \beta y[n-1] - y[n-1] + x[n] \quad (3)$$

Which may be simplified to:

$$y[n] = y[n-1] - \beta^{-1} y[n-1] + \beta^{-1} x[n] \quad (4)$$

$$\beta = 2^n \text{ where } n \text{ is an integer} \quad (5)$$

In this equation, x[n] may represent an input of the filter and y[n] may represent an output of the filter. For example, if an input is provided that is a 12-bit signal, the input may be right justified and provided to filter 502. In this example, filter 502 may have a $\beta=2^{10}$. The resulting output may be a 22-bit result. The pole frequency may be determined by the following equation:

$$f_p = \frac{f_s}{(2\pi)(1023)} \quad (6)$$

An example of pseudo code that may be used to implement such a filter in a reprogrammable block, such as a PSoC block, may be:

AvgBY=AvgBY-(AvgBY>>10)+X;

When such a coded filter is implemented, the 12 bit data signal that was initially received may be shifted to have the 12 data bits and 10 residual bits. In this way, the 12-bit signal may be left-justified by 10 bits, and may be fed to the filter. The filter may have a $\beta=2^{10}$ with a pole frequency the given by equation 6 discussed above. The resulting output may be a 32-bit result. Additional pseudo code implementations may be implemented to achieve different outputs with different bit widths. Such additional implementations may include:

$$AvgBY=AvgBY-(AvgBY>>10)+(X<<10);$$

$$AvgBY=AvgBY-(AvgBY>>4)+(X>>4); \text{ and}$$

$$AvgBY=AvgBY-(AvgBY>>8)+(X>>8).$$

Figure 6:
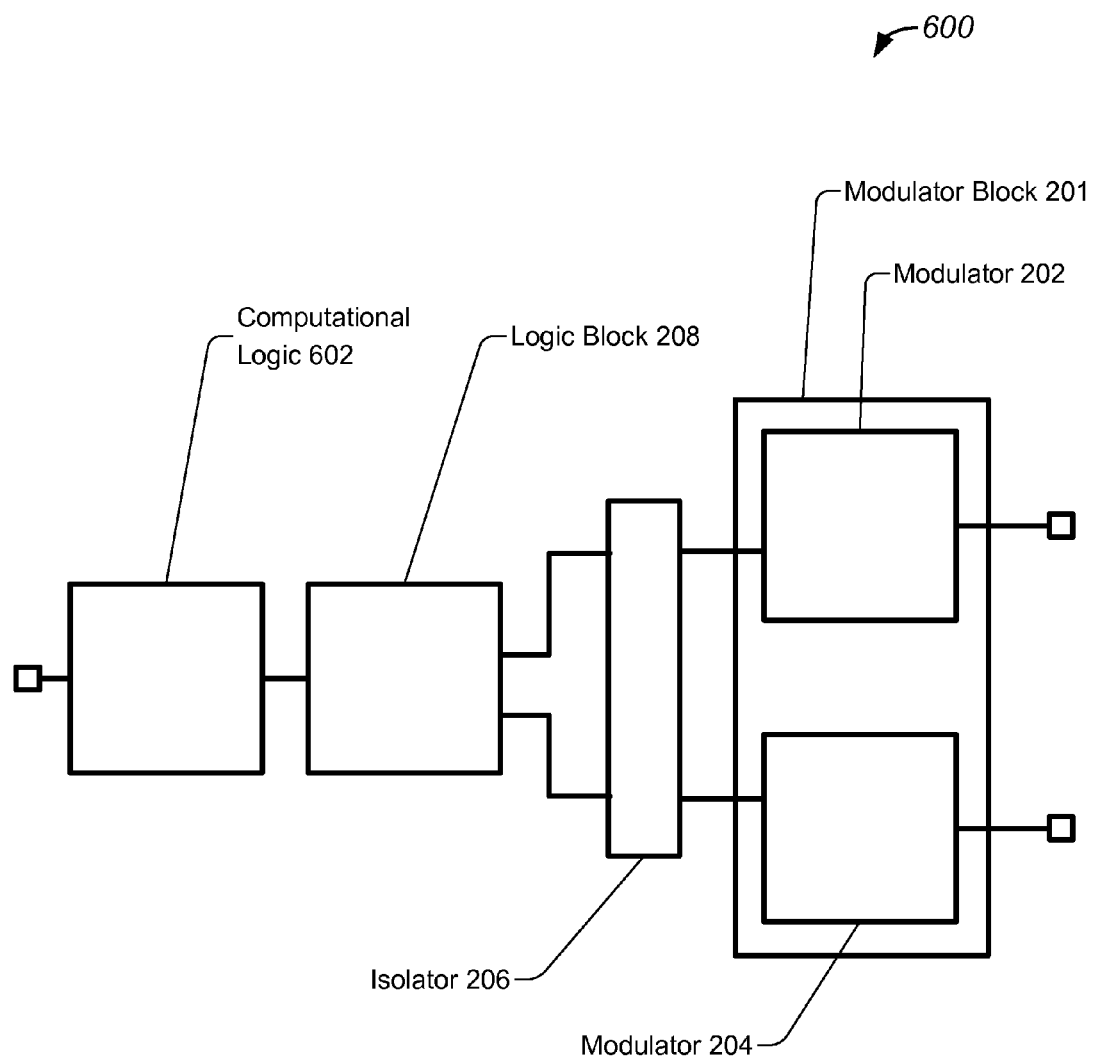
FIG. 6 illustrates an additional example of a circuit for metering energy and power, configured in accordance with various embodiments.

FIG. 6 illustrates an additional example of a circuit for metering energy and power, configured in accordance with various embodiments. As similarly discussed above, embodiments disclosed herein may be configured to implement a real power computation that determines a measured or metered power of another system component, such as a power supply or an inverter. In various embodiments, circuit 600 may include various components configured to receive analog signals as well as components configured to compute a real power based on the received analog signals. Thus, circuit 600 may include modulator block 201 which may further include modulator 202 and modulator 204 implemented within modulator block 201. Furthermore, circuit 600 may also include isolator 206 and logic block 208.

In various embodiments, circuit 600 may include a processing block that is configured as computational logic 602 which may be configured to calculate an average of logic block 208 which may be the third bit stream. Accordingly, computational logic 602 may be configured to generate a fourth bit stream that characterizes an average of the product of the sensed voltage and sensed current received via the analog signals. In this way, computational logic 602 may be configured to generate an output signal that represents a sensed or measured average power over a period of time. In various embodiments, the period of time may be a designated period of time, and computational logic 602 may be configured to generate or determined an average based on a value of the third bit stream over a previous designated number of clock cycles. In this way, an output generated by computational logic 602 may represent an average measured power over a designated period of time.

Figure 7:
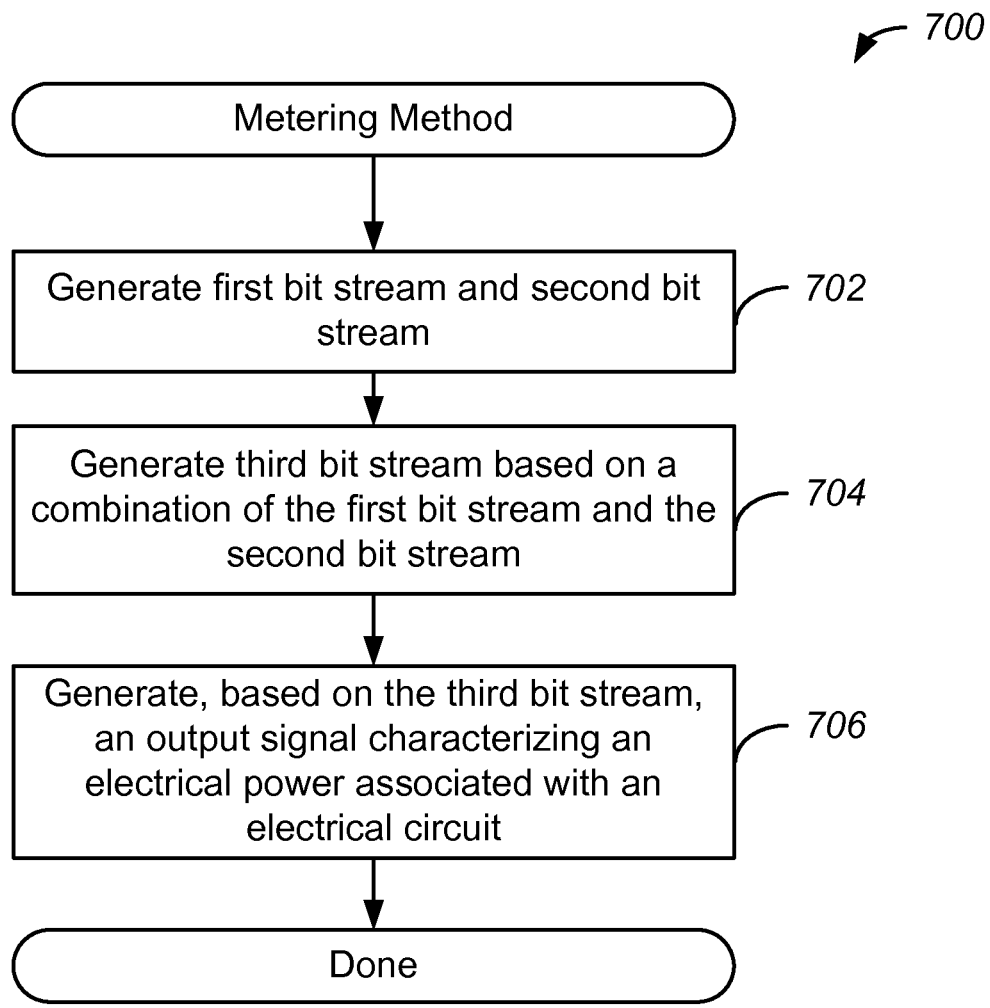
FIG. 7 illustrates a flow chart of an example of a method for metering energy and power, implemented in accordance with some embodiments.

FIG. 7 illustrates a flow chart of an example of a method for metering energy and power, implemented in accordance with some embodiments. As similarly discussed above, metering circuits and systems as disclosed herein may be configured to measure, meter, and compute energy and power levels associated with various power components, which may be power supplies and power inverters. As will be discussed in greater detail below, computing such energy and power levels may involve the use of modulators to generate bit streams, as well as additional logic to generate an output signal representative of a measured energy and/or power based on the generated bit streams.

Method 700 may commence with operation 702 during which a first bit stream and a second bit stream may be generated. As discussed above, the first bit stream and second bit stream may be generated by modulators which may be sigma delta modulators. Accordingly, a first modulator may receive a first analog signal which may be a sensed voltage. Moreover, a second modulator may receive a second analog signal which may be a sensed current. The modulators may convert the analog signals to encoded single-bit streams of data values. Moreover, as discussed above, such bit streams may be generated on a first side or area relative to an isolator.

Method 700 may proceed to operation 704 during which a third bit stream may be generated based on a combination of the first bit stream and the second bit stream. In various embodiments, the combination of the first and second bit stream may be implemented through one or more mathematical operations, such as multiplication. Accordingly, the third bit stream may characterize or represent a product of the voltage and current associated with the first and second bit streams respectively. Moreover, the first and second bit stream may be combined by a component implemented on a second side or area relative to the isolator, and on a different side of galvanic isolation from the modulators.

Method 700 may proceed to operation 706 during which an output signal may be generated based on the third bit stream. In some embodiments, the output signal may characterize an electrical energy associated with the electrical circuit. Accordingly, one or more components may be configured to generate an output signal that represents a measured energy and/or power. As previously discussed, the measured energy and/or power may be associated with a component, such as a power supply or an inverter. Thus, the output signal generated during operation 706 may provide a representation of the energy and/or power of the power supply or inverter that may be used by other components for subsequent analysis.

Figure 8:
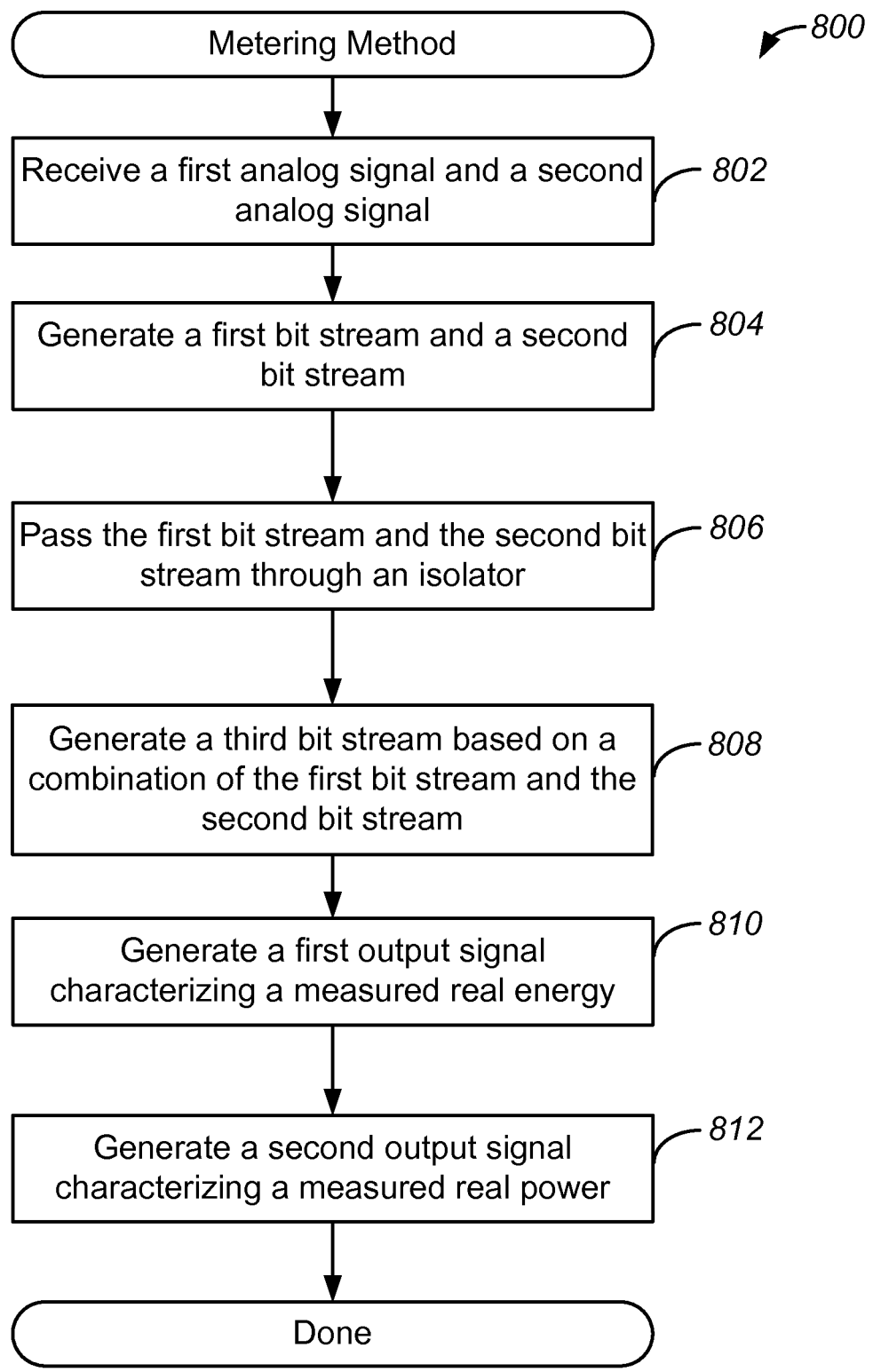
FIG. 8 illustrates a flow chart of another example of a method for metering energy and power, implemented in accordance with some embodiments.

FIG. 8 illustrates a flow chart of another example of a method for metering energy and power, implemented in accordance with some embodiments. As has been discussed above, metering circuits and systems as disclosed herein may be configured to measure, meter, and compute energy and power levels associated with various power components. Moreover, computing such energy and power levels may involve the use of modulators to generate bit streams, as well as additional logic to generate an output signal representative of a measured energy and/or power based on the generated bit streams. Furthermore, such modulators and additional logic may be implemented on different sides of galvanic isolation to further reduce the computational complexity and hardware intensiveness of the computing of the energy and/or power.

Method 800 may commence with operation 802 during which a first analog signal and a second analog signal may be received. As similarly discussed above, analog signals may be measured and received from various locations and components within an electrical circuit or system. For example, a voltage and current may be measured in an AC/DC power supply or an inverter. Accordingly, such signals may be readings or measurements received from one or more probes implemented in such power supplies and inverters, and such signals may be analog signals characterizing an analog voltage and an analog current.

Method 800 may proceed to operation 804 during which a first bit stream and a second bit stream may be generated. As discussed above, the first bit stream and second bit stream may be generated by modulators which may be sigma delta modulators. Accordingly, a first modulator may receive a first analog signal which may be a sensed voltage. Moreover, a second modulator may receive a second analog signal which may be a sensed current. The modulators may convert the analog signals to encoded single-bit streams of data values. Moreover, as discussed above, such bit streams may be generated on a first side or area relative to an isolator.

Method 800 may proceed to operation 806 during which the first bit stream and the second bit stream may be passed through an isolator. Accordingly, outputs of the modulators, which may be single bit streams of data, may be provided to inputs of an isolator which may be configured to provide one-bit isolated channels through which signals may be passed to the second side or area. Accordingly, during operation 806, the first bit stream and the second bit stream may be received at the isolator and may be provided to another component, such as a logic block, via the isolator.

Method 800 may proceed to operation 808 during which a third bit stream may be generated based on a combination of the first bit stream and the second bit stream. As similarly discussed above, the first bit stream and the second bit stream may be combined to generate a third bit stream that represents a product or multiplication of the first bit stream and the second bit stream, and further represents a product or multiplication of the sensed voltage and the sensed current, as previously discussed.

Method 800 may proceed to operation 810 during which a first output signal may be generated. In various embodiments, the first output signal may characterize or represent a measured real energy. Accordingly, as discussed above with reference to FIGS. 2 and 4, a processing block may be configured to implement one or more components, such as an integrator, which may be configured to integrate the third bit stream and generate an output that represents a measured energy associated with the power supply or inverter. Moreover, as discussed above, the processing block may be implemented in reconfigurable logic which may be dynamically reconfigured. Accordingly, the processing block may be dynamically reconfigured specifically to implement the computation of the measured energy. Furthermore, operation 810 may be performed optionally or in conjunction with operation 812 discussed in greater detail below.

Method 800 may proceed to operation 812 during which a second output signal may be generated. In various embodiments, the second output signal may characterize or represent a measured real power. In various embodiments, the second output signal may characterize or represent a measured real power. Accordingly, as discussed above with reference to FIGS. 2, 5, and 6, a processing block may be configured to implement one or more components, such as a filter or computational logic, that may be configured to perform one or more operations on the third bit stream, such as filter the third bit stream or average the third bit stream, and generate the second output which may represent a measured power associated with the power supply or power inverter. Moreover, as discussed above, the processing block may be implemented in reconfigurable logic which may be dynamically reconfigured. Accordingly, the processing block may be dynamically reconfigured specifically to implement the computation of the measured power. Furthermore, operation 812 may be performed optionally or in conjunction with operation 810 discussed above.

Although the foregoing concepts have been described in some detail for purposes of clarity of understanding, it will be apparent that certain changes and modifications may be practiced within the scope of the appended claims. It should be noted that there are many alternative ways of implementing the processes, systems, and devices. Accordingly, the present examples are to be considered as illustrative and not restrictive.

What is claimed is:

1. A device comprising:
    first processing logic coupled to an isolator and configured to receive a first bit stream from a first modulator via the isolator, the first bit stream being generated by the first modulator based on a first analog signal, the first processing logic further configured to receive a second bit stream from a second modulator via the isolator, the second bit stream being generated by the second modulator based on a second analog signal, the first processing logic further configured to generate a third bit stream based on a combination of the first bit stream with the second bit stream after the first bit stream and second bit stream have passed through the isolator; and
    second processing logic configured to generate an output signal based, at least in part, on one or more values of the third bit stream, the output signal characterizing a measurement of an electrical power associated with an electrical circuit, wherein the second processing logic comprises a digital filter configured to filter the third bit stream based on at least one property of a power supply.

2. The device of claim 1, wherein the first modulator is a first sigma delta modulator, and wherein the second modulator is a second sigma delta modulator.

3. The device of claim 1, wherein the first analog signal is a voltage signal, and wherein the second analog signal is a current signal.

4. The device of claim 1, wherein the first processing logic is configured to combine the first bit stream with the second bit stream in accordance with a logical AND operation.

5. The device of claim 1, wherein the second processing logic comprises computational logic configured to average values included in the third bit stream, and wherein the second processing logic is further configured to generate the output signal based on an average of values included in the third bit stream.

6. The device of claim 1, wherein the second processing logic is configured to integrate values included in the third bit stream, and further configured to generate the output signal based on an integration of values included in the third bit stream.

7. The device of claim 1 further comprising an isolator positioned between the first processing logic and the first and second modulators.

8. The device of claim 1, wherein the output signal further characterizes a measured electrical energy associated with the first analog signal and the second analog signal.

9. The device of claim 1, wherein the second processing logic is configured to provide the output signal to a power controller.

10. A method comprising:
    receiving a first analog signal at a first modulator;
    receiving a second analog signal at a second modulator;
    generating, using the first modulator, a first bit stream based on the first analog signal;
    generating, using the second modulator, a second bit stream based on the second analog signal;
    generating, using first processing logic, a third bit stream based on a combination of the first bit stream with the second bit stream after the first bit stream and second bit stream have passed through an isolator; and
    generating, using second processing logic, an output signal based on, at least in part, one or more values of the third bit stream, the output signal characterizing an electrical power associated with an electrical circuit,
    wherein the generating of the output signal comprises filtering, using a digital filter, the third bit stream based on at least one property of a power supply.

11. The method of claim 10, wherein the first analog signal is a voltage signal, and wherein the second analog signal is a current signal.

12. The method of claim 10, wherein the generating of the third bit stream comprises;
    implementing a logical AND operation on the first bit stream and the second bit stream.

13. The method of claim 10, wherein the generating of the output signal comprises averaging values included in the third bit stream.

14. The method of claim 10, wherein the generating of the output signal comprises integrating values included in the third bit stream.

15. A system comprising:
   a first portion of a power component, the first portion comprising
      a modulator block comprising a first modulator and a second modulator, the first modulator configured to convert a first analog signal into a first bit stream, and the second modulator configured to convert a second analog signal into a second bit stream;
   an isolator coupled to the first portion of the power component and configured to receive the first bit stream and the second bit stream from the modulator block;
   a second portion of the power component coupled to the isolator, the second portion comprising:
      first processing logic coupled to the isolator and configured to receive the first bit stream and the second bit stream from the isolator, the first processing logic configured to generate a third bit stream based on a combination of the first bit stream with the second bit stream after the first bit stream and second bit stream have passed through the isolator;
      second processing logic configured to generate an output signal characterizing an electrical power associated with an electrical circuit, the output signal based, at least in part, on one or more values of the third bit stream, wherein the second processing logic comprises a digital filter configured to filter the third bit stream based on at least one property of a power supply; and
   a controller configured to receive the output signal from the second processing logic, and further configured to generate a control signal based on the output signal.

16. The system of claim 15, wherein the first modulator is a first sigma delta modulator, wherein the second modulator is a second sigma delta modulator, wherein the first analog signal is a voltage signal, and wherein the second analog signal is a current signal.

17. The system of claim 15, wherein the power component is a power inverter included in a solar panel, and wherein the first processing logic is configured to combine the first bit stream with the second bit stream in accordance with a logical AND operation.

18. The system of claim 15, wherein the second processing logic is configured to integrate values included in the third bit stream, and further configured to generate the output signal based on a result of the integration of the values in the third bit stream.

* * * * *